(12) United States Patent
Park et al.

(10) Patent No.: US 12,347,520 B2
(45) Date of Patent: Jul. 1, 2025

(54) COMPUTING-IN-MEMORY DEVICE INCLUDING DIGITAL-TO-ANALOG CONVERTER BASED ON MEMORY STRUCTURE

(71) Applicant: Korea University Research and Business Foundation, Seoul (KR)

(72) Inventors: Jongsun Park, Seoul (KR); Joonhyung Kim, Seoul (KR); Kyeong-ho Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 133 days.

(21) Appl. No.: 18/342,013

(22) Filed: Jun. 27, 2023

(65) Prior Publication Data

US 2024/0127873 A1 Apr. 18, 2024

(30) Foreign Application Priority Data

Jun. 28, 2022 (KR) .................. 10-2022-0078594
Mar. 22, 2023 (KR) .................. 10-2023-0037496

(51) Int. Cl.
*G11C 7/16* (2006.01)
*G11C 7/10* (2006.01)
*G11C 8/08* (2006.01)

(52) U.S. Cl.
CPC .............. *G11C 7/16* (2013.01); *G11C 7/1069* (2013.01); *G11C 8/08* (2013.01)

(58) Field of Classification Search
CPC ........... G11C 7/16; G11C 7/1069; G11C 8/08; G11C 11/418; G11C 5/025; G11C 7/1006; G11C 11/419; G06F 15/7821; G06F 7/5443; G06N 3/063; H03M 1/662
USPC .................................................... 365/185.03
See application file for complete search history.

(56) References Cited

U.S. PATENT DOCUMENTS

| 2012/0218235 | A1 | 8/2012 | Peng et al. |
| 2021/0263672 | A1 | 8/2021 | Chang et al. |
| 2021/0390391 | A1* | 12/2021 | Jung ............... G11C 7/1006 |
| 2022/0291900 | A1* | 9/2022 | Mirhaj .............. G11C 11/54 |

FOREIGN PATENT DOCUMENTS

| KR | 10-1827779 B1 | 2/2018 |
| KR | 10-2318820 B1 | 10/2021 |

* cited by examiner

*Primary Examiner* — Amir Zarabian
*Assistant Examiner* — Minh Dinh
(74) *Attorney, Agent, or Firm* — NSIP Law

(57) ABSTRACT

Disclosed is a computing-in-memory device, which includes a memory cell array including an analog multiplication unit that performs a multiply-accumulate (MAC) operation on a pre-stored weight and a first analog voltage corresponding to multi-bit input data, and a driver that applies the multi-bit input data to the analog multiplication unit, and the analog multiplication unit includes a digital-to-analog converter that converts the multi-bit input data into the first analog voltage.

8 Claims, 10 Drawing Sheets

[Fig. 1a]
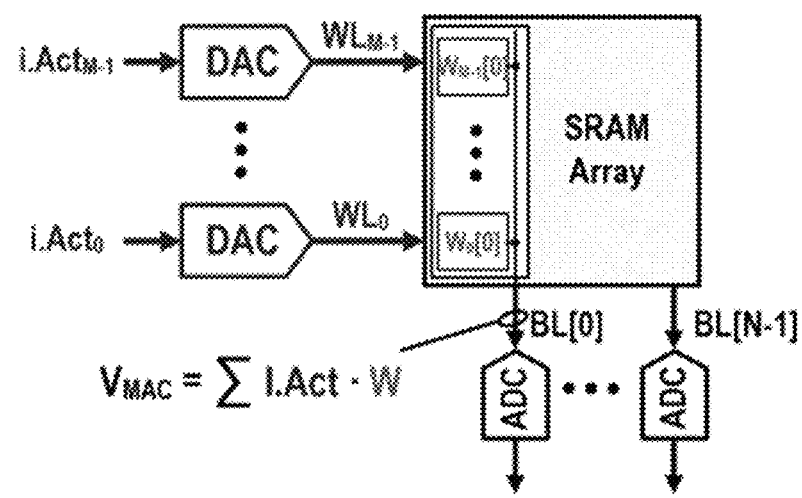
[Fig. 1b]
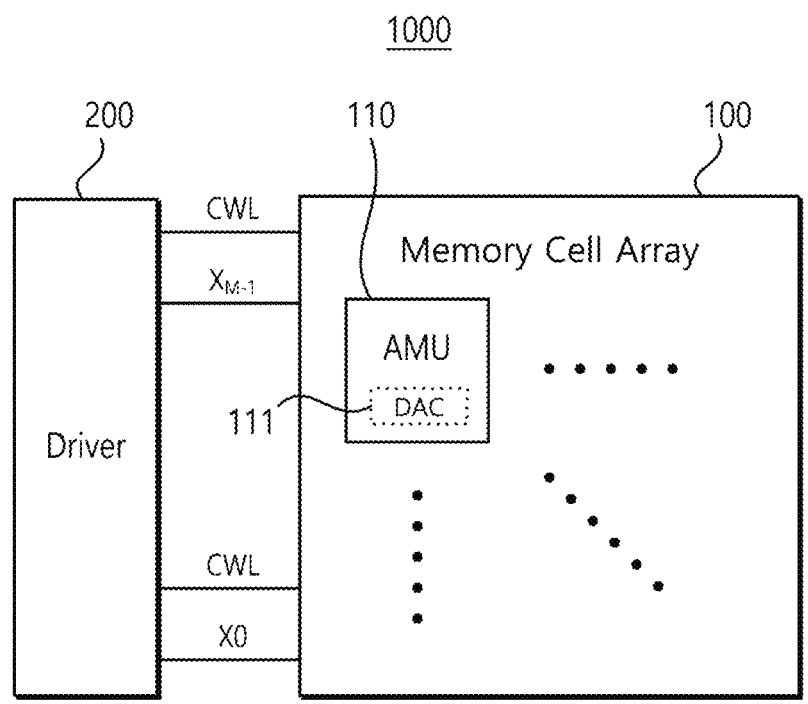

[Fig. 2]
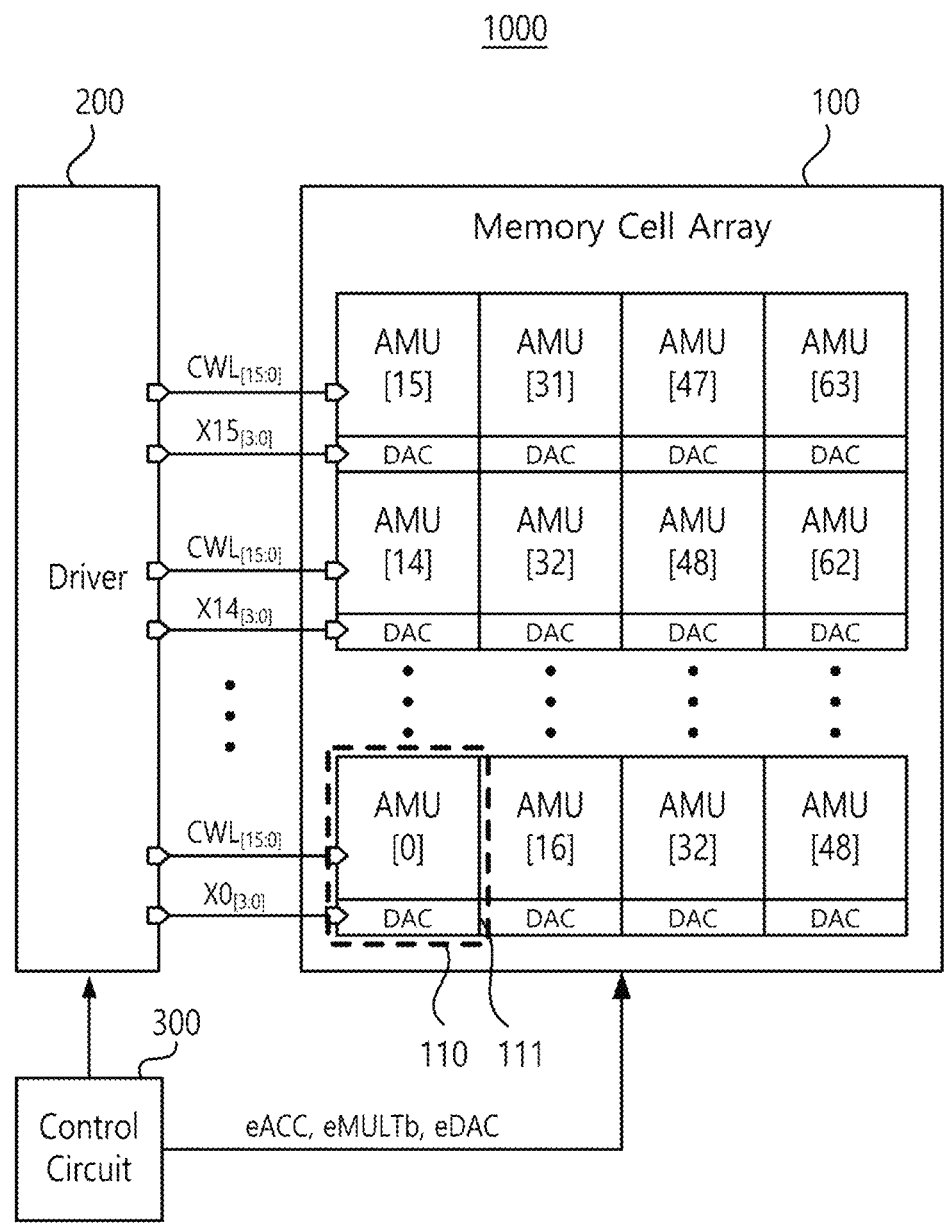

[Fig. 3]
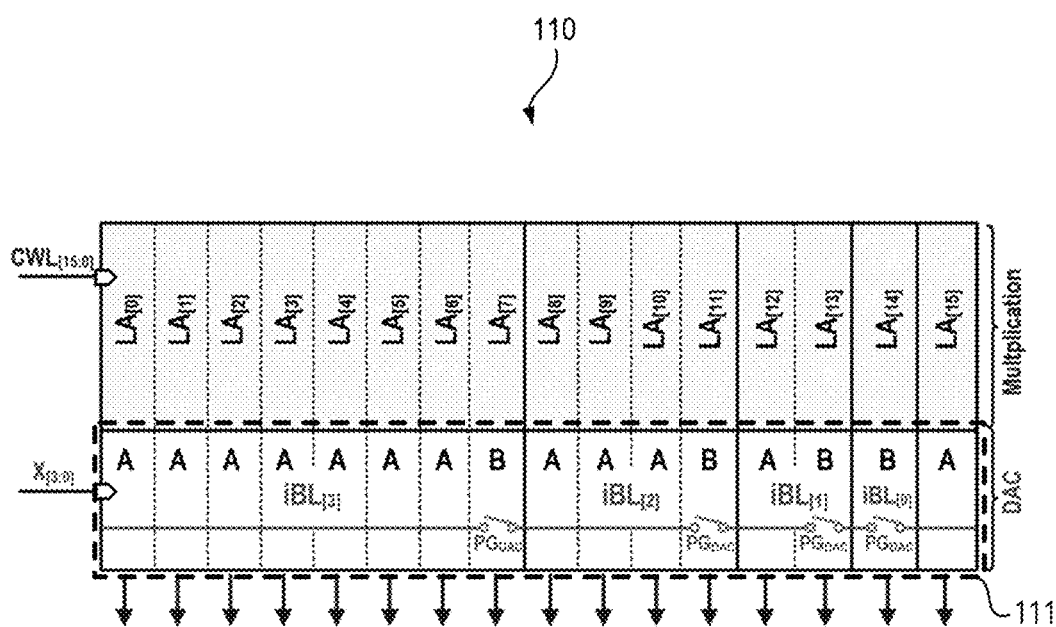

【Fig. 4a】
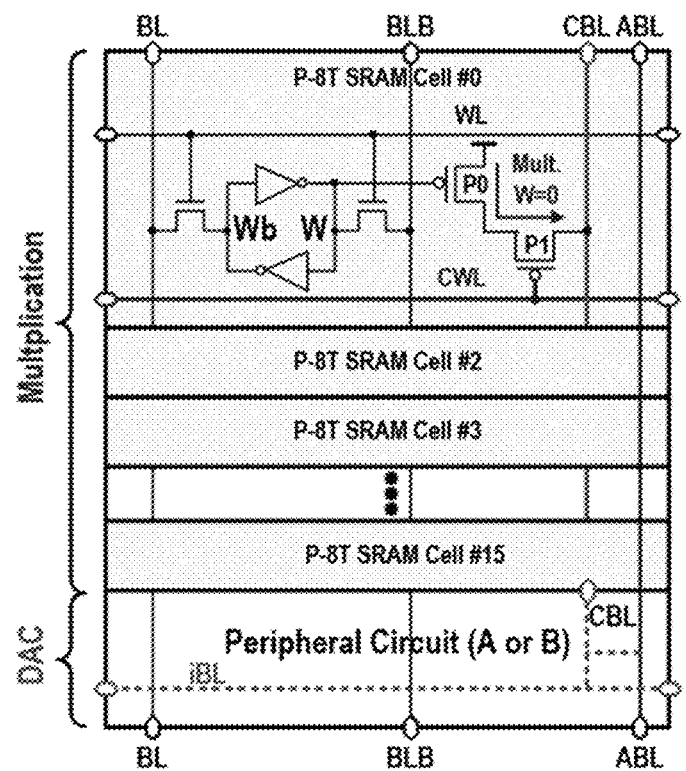
【Fig. 4b】
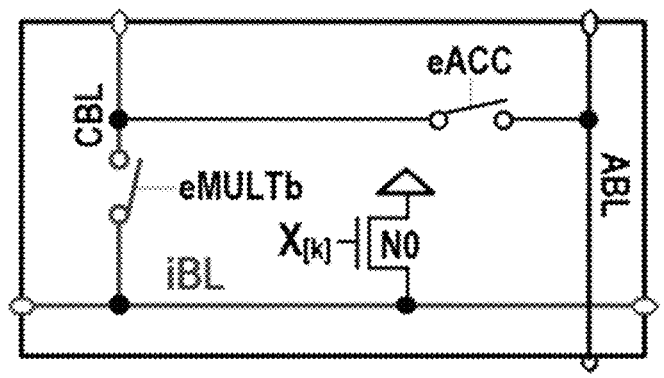

[Fig. 4c]
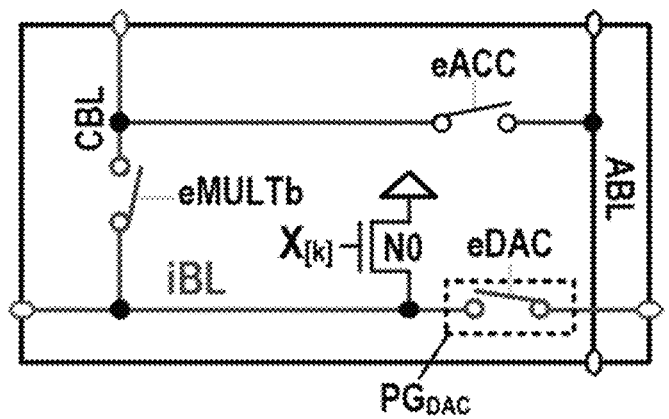

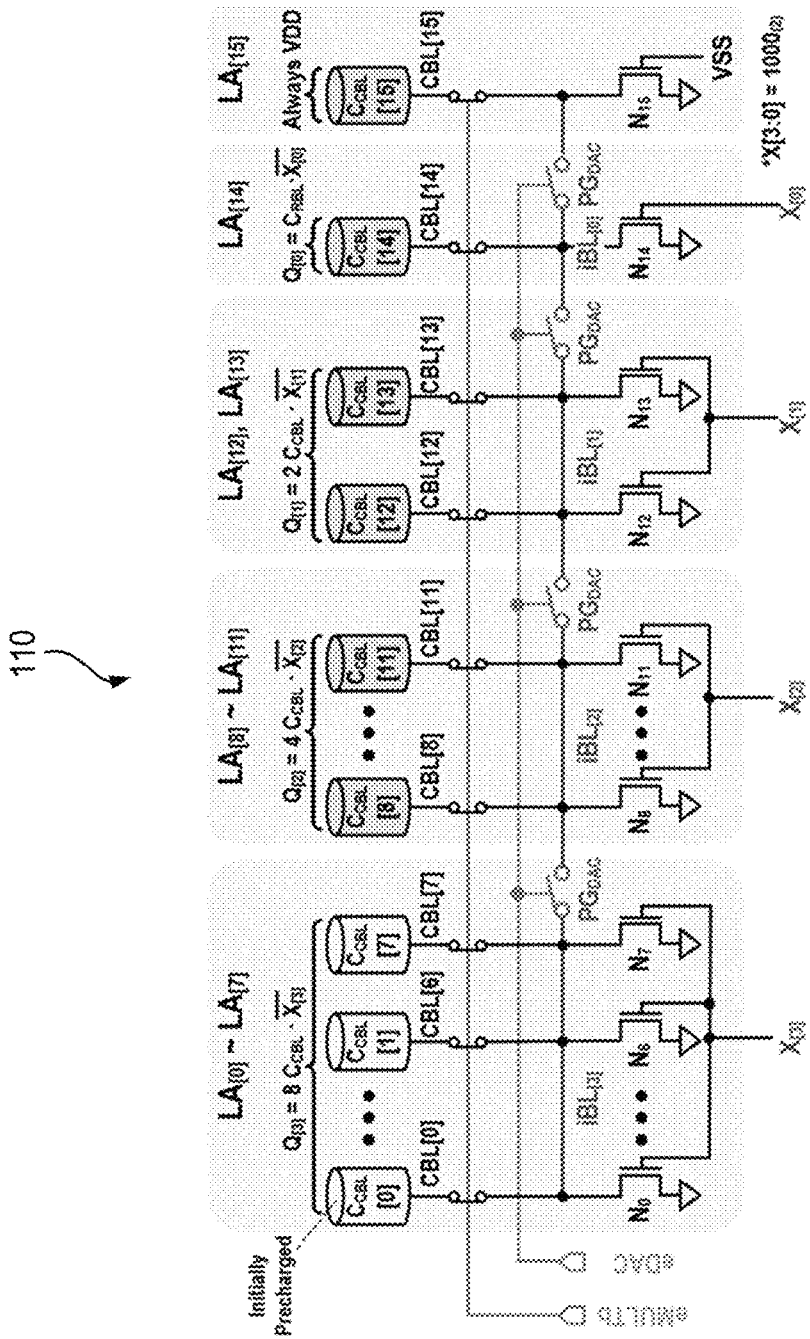
[Fig. 5]

[Fig. 6a]
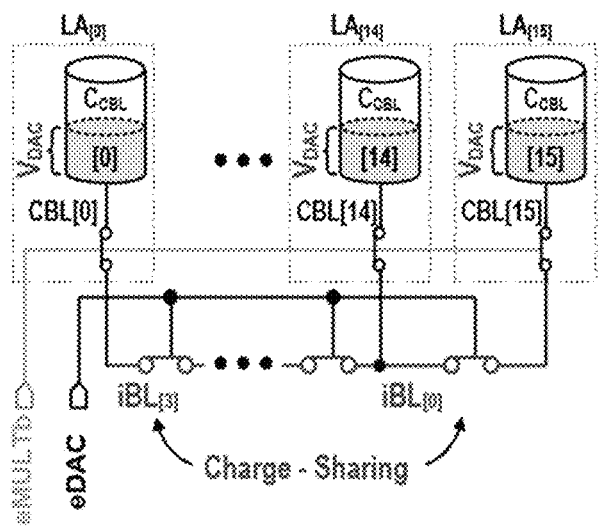
[Fig. 6b]
| 4-bit i.Act $X_{[3:0]}$ | 16 level Analog $V_{CBL}$ |
|---|---|
| 0000 | VDD : $0_{(10)}$ |
| 0001 | 15/16·VDD : $1_{(10)}$ |
| 0010 | 14/16·VDD : $2_{(10)}$ |
| ⋮ | ⋮ |
| 1110 | 2/16·VDD : $14_{(10)}$ |
| 1111 | 1/16·VDD : $15_{(10)}$ |

【Fig. 7a】
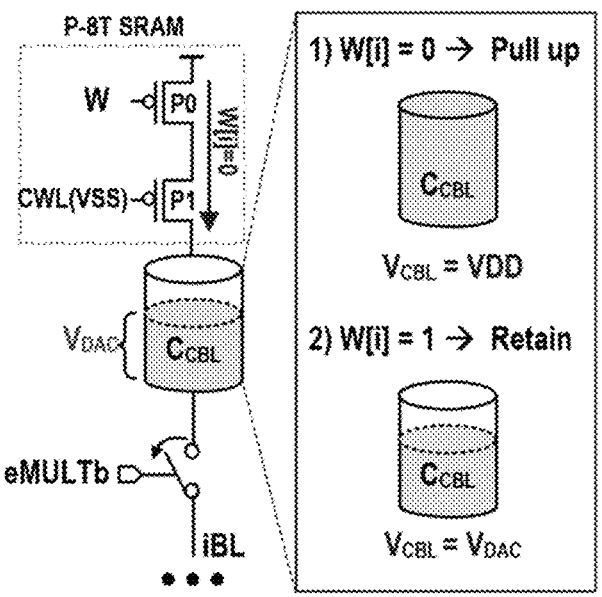
【Fig. 7b】
| 4-bit i.Act $X_{[3:0]}$ | 1-bit Weight (W) | 16 level Mult. Result $V_{CBL}$ |
|---|---|---|
| don't care | 0<br>$V_{DAC} \rightarrow VDD$ | $VDD : 0_{(10)}$ |
| 0000 | | $VDD : 0_{(10)}$ |
| 0001 | | $15/16 \cdot VDD : 1_{(10)}$ |
| 0010 | | $14/16 \cdot VDD : 2_{(10)}$ |
| ⋮ | 1<br>$V_{DAC} \rightarrow V_{DAC}$ | ⋮ |
| 1110 | | $2/16 \cdot VDD : 14_{(10)}$ |
| 1111 | | $1/16 \cdot VDD : 15_{(10)}$ |

[Fig. 8a]
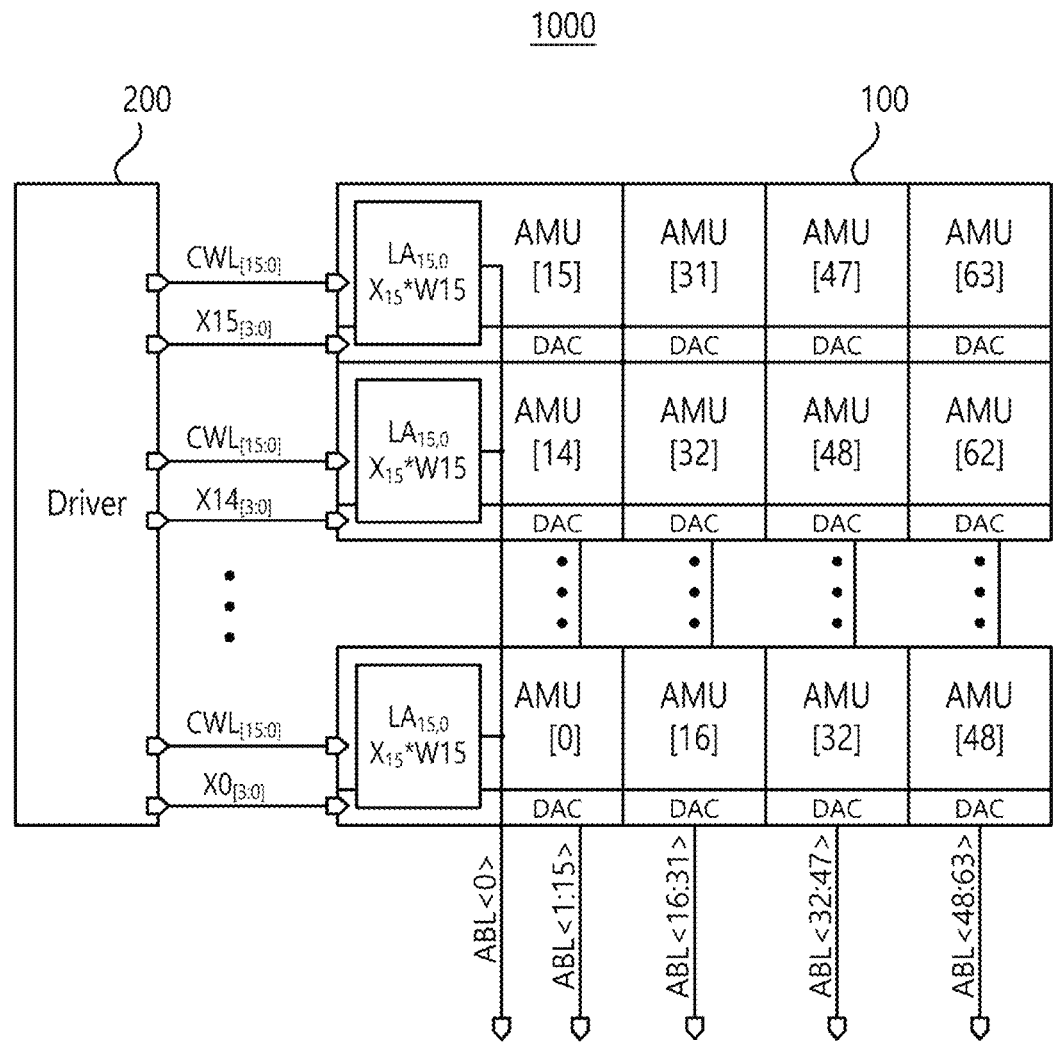
[Fig. 8b]
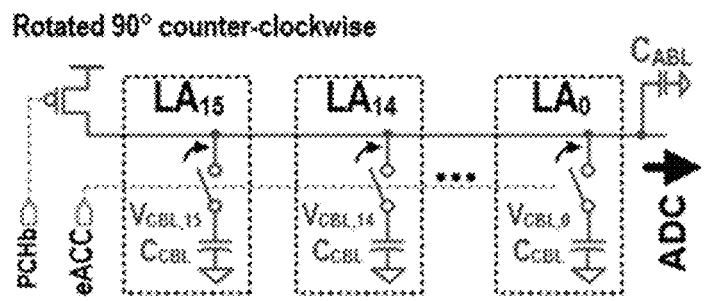

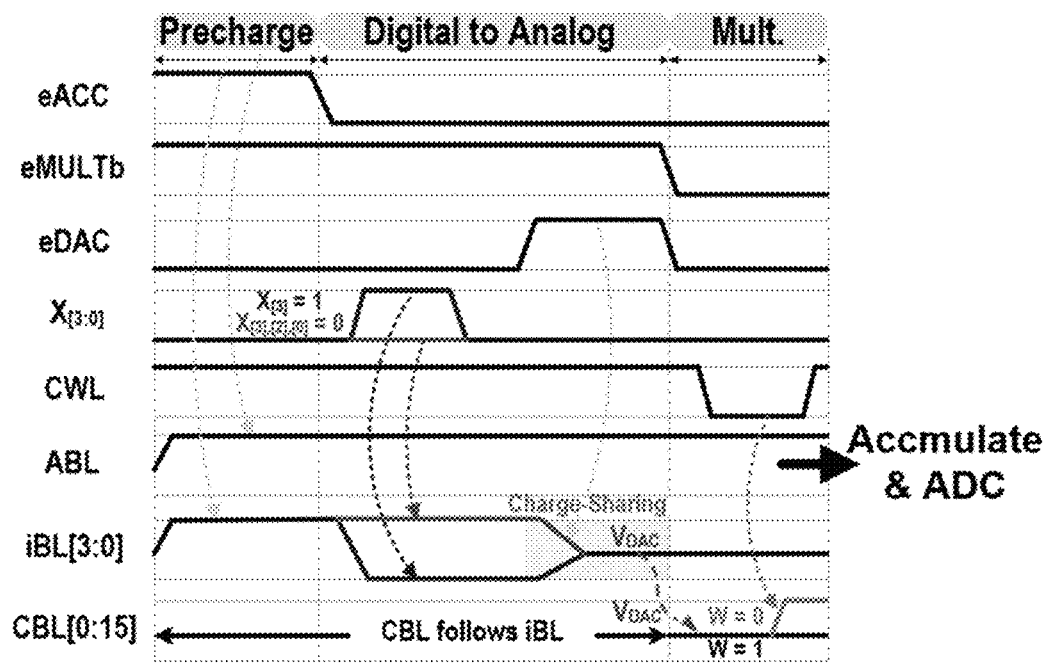
[Fig. 9]

COMPUTING-IN-MEMORY DEVICE INCLUDING DIGITAL-TO-ANALOG CONVERTER BASED ON MEMORY STRUCTURE

CROSS REFERENCE TO RELATED APPLICATIONS

This application claims priority under 35 U.S.C. § 119 to Korean Patent Application Nos. 10-2022-0078594, filed on Jun. 28, 2022, and 10-2023-0037496, filed on Mar. 22, 2023, in the Korean Intellectual Property Office, the disclosures of which are incorporated by reference herein in their entireties.

TECHNICAL FIELD

Embodiments of the present disclosure described herein relate to a computing-in-memory device including a digital-to-analog converter based on a memory structure.

BACKGROUND ART

In a conventional computer structure, a memory supporting read/write operations and an operator supporting data operation are separated from each other. In this case, energy consumed when the operator performs an operation is very large compared to energy consumed when data moves between the memory and the operator. Based on such characteristics, the conventional computer structures are very energy efficient in existing applications requiring little data movement and complex calculations.

However, since a multiply-accumulate (MAC) operation used in a convolution layer of an artificial neural network requires the movement of a huge amount of data, the conventional computer structures are very inefficient in terms of energy.

To solve this issue, a memory technology called computing-in-memory (CIM) is being developed that reduces data movement between the memory and the operator by adding computing operations in the memory performing only read/write operations.

To perform MAC operations, which account for most of the total operations of artificial neural networks, in memory, a process of converting digital inputs into analog values is required. To this end, conventional CIM technology utilizes a general digital-to-analog converter (DAC).

DISCLOSURE OF THE INVENTION

Technical Problem

Embodiments of the present disclosure provide a computing in-memory device capable of increasing the accuracy of a multiply-accumulate (MAC) operation by reducing the number of data movements between the memory and the operator in artificial intelligence operations such as DNNs (Deep Neural Networks) by performing the MAC operation inside the memory, and by converting multi-bit input data into an analog voltage using a DAC inside the memory.

Technical Solution

According to an embodiment of the present disclosure, a computing in-memory device includes a memory cell array including an analog multiplication unit that performs a multiply-accumulate (MAC) operation on a pre-stored weight and a first analog voltage corresponding to multi-bit input data, and a driver that applies the multi-bit input data to the analog multiplication unit, and the analog multiplication unit includes a digital-to-analog converter that converts the multi-bit input data into the first analog voltage.

According to an embodiment, the analog multiplication unit may include a plurality of local arrays corresponding to the number of bits of the multi-bit input data, and each of the plurality of local arrays may include a memory cell that stores the weight and a peripheral circuit that forms the digital-to-analog converter.

According to an embodiment, among the plurality of local arrays, the number of local arrays corresponding to the first digit and the number of local arrays corresponding to the second digit of the multi-bit input data are different from each other.

According to an embodiment, the analog multiplication unit may receive a bit value corresponding to each digit of the multi-bit input data through the peripheral circuit of the local array corresponding to each digit of the multi-bit input data.

According to an embodiment, the digital-to-analog converter, when the multi-bit input data is applied in a state in which the peripheral circuits belonging to different digits are electrically separated, may convert the multi-bit input data into the first analog voltage by electrically connecting the peripheral circuits belonging to the different digits.

According to an embodiment, the analog multiplication unit, when a control signal for reading the pre-stored weight in the memory cell is applied from the driver, may perform a multiplication operation on the pre-stored weight in the memory cell and the first analog voltage.

According to an embodiment, the analog multiplication unit may perform an accumulation operation on the multiplication operation results performed in each of the plurality of local arrays, and may output the accumulation operation result as a second analog voltage.

According to an embodiment, the computing in-memory device may further include an analog-to-digital converter that converts the second analog voltage into a digital value.

According to an embodiment, the driver may apply the control signal to the analog multiplication unit through a computation word line and may apply the multi-bit input data to the digital-to-analog converter through an input line separate from the computation word line.

According to an embodiment, the memory cell may be a static random access memory (SRAM) cell.

Advantageous Effects

According to an embodiment of the present disclosure, as a MAC operation inside a memory is performed, it is possible to reduce the number of data movements between a memory and an operator in artificial intelligence operations such as DNNs (Deep Neural Networks). Accordingly, the energy efficiency of the artificial intelligence operations may increase. In addition, when multi-bit input data is converted into an analog voltage, it is possible to have an advantage in process yield and to increase the accuracy of MAC operation by using a DAC inside the memory. In addition, since more than 4 bits of input data can be used, higher artificial intelligence operation accuracy may be obtained than operations on 1-bit or 2-bit input data.

BRIEF DESCRIPTION OF THE FIGURES

FIG. 1a is a diagram for describing a conventional computing in-memory technology.

FIG. 1b is a block diagram of a computing in memory device, according to an embodiment of the present disclosure.

FIG. 2 is a block diagram illustrating an implementation example of a computing in-memory device, according to an embodiment of the present disclosure.

FIG. 3 is a diagram for describing a configuration of an analog multiplication unit, according to an embodiment of the present disclosure.

FIG. 4a is a diagram illustrating a configuration of a local array, according to an embodiment of the present disclosure.

FIG. 4b is a circuit diagram of a peripheral circuit, according to an embodiment of the present disclosure.

FIG. 4c is a circuit diagram of a peripheral circuit, according to an embodiment of the present disclosure.

FIG. 5 is a diagram for describing a digital-to-analog conversion operation of an analog multiplication unit, according to an embodiment of the present disclosure.

FIG. 6a is a diagram for describing a digital-to-analog conversion operation of an analog multiplication unit, according to an embodiment of the present disclosure.

FIG. 6b is a diagram for describing a digital-to-analog conversion operation of an analog multiplication unit, according to an embodiment of the present disclosure.

FIG. 7a is a diagram for describing a multiplication calculation operation of an analog multiplication unit, according to an embodiment of the present disclosure.

FIG. 7b is a diagram for describing a multiplication calculation operation of an analog multiplication unit, according to an embodiment of the present disclosure.

FIG. 8a is a diagram for describing an accumulation calculation operation of an analog multiplication unit, according to an embodiment of the present disclosure.

FIG. 8b is a diagram for describing an accumulation calculation operation of an analog multiplication unit, according to an embodiment of the present disclosure.

FIG. 9 is a diagram illustrating waveforms of various signals of a computing in memory device, according to an embodiment of the present disclosure.

DETAILS FOR CARRYING OUT THE INVENTION

Various embodiments of the present disclosure described with reference to the following drawings are not intended to limit the scope to specific embodiments, but should be understood to include various modifications, equivalents, and/or alternatives. With regard to the description of drawings, similar components may be marked by similar reference marks/numerals.

In describing the scope and spirit of the present disclosure, when it is determined that the specific description of the known, related art unnecessarily obscures the gist of the present disclosure, the detailed description thereof will be omitted. In addition, additional descriptions of the same configuration will be omitted as much as possible to avoid redundancy.

Terms used below are used to describe embodiments, and are not intended to limit and/or limit the present disclosure. Singular expressions include plural expressions unless the context clearly dictates otherwise.

Hereinafter, terms such as 'include' or 'have' are intended to designate that there is a feature, number, step, operation, component, part, or combination thereof described in the specification, but it should be understood that the presence or addition of one or more other features, numbers, steps, operations, components, parts, or combinations thereof is not precluded.

Expressions such as "first", "second", or the like used below may modify various components regardless of order and/or importance, and are used only to distinguish one element from another element and do not limit the elements.

It should be understood that when an element (e.g., a first element) is referred to as being "operatively or communicatively coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it will be understood that there are no intervening element (e.g., a third element).

Unless otherwise defined, terms used in the embodiments of the present disclosure may be interpreted as meanings commonly known to those skilled in the art.

Hereinafter, various embodiments of the present disclosure will be described in detail with reference to the accompanying drawings.

FIG. 1a is a diagram for describing a conventional computing-in-memory technology.

To perform an analog operation such as the MAC operation using a memory, which is a digital circuit, a digital-to-analog converter (DAC) that converts a digital input into an analog value and an analog-to-digital converter (ADC) that outputs the MAC operation result in digital form are required.

Referring to FIG. 1a, when an input value i.Act, which is a digital value, is input to the DAC, the DAC converts the input value i.Act into an analog voltage. The input value i.Act converted into an analog value is input to each cell of a static random access memory (SRAM) array through a word line WL.

Accordingly, a multiplication operation is performed on a weight value W of an artificial intelligence model stored in each cell and the input value i.Act converted to the analog voltage, and a result of the multiplication operation performed in each cell is accumulated for each bit line BL and is output as an analog voltage VMAC. On the other hand, VMAC, which is the result of the MAC operation, is input to the ADC, converted back to a digital value, and used for artificial intelligence operation.

In this case, in the conventional computing-in-memory technology, a general DAC as illustrated in FIG. 1a is used to convert a digital input into an analog value.

In general, as the number of bits of the input increases, the accuracy of the artificial intelligence operation increases. However, the overhead of the DAC increases accordingly in terms of area, complexity, energy, etc. Therefore, when computing-in-memory hardware is configured using a general DAC as illustrated in FIG. 1a, there is a limit to increasing the accuracy of artificial intelligence operation.

FIG. 1b is a block diagram of a computing in memory device, according to an embodiment of the present disclosure.

Referring to FIG. 1b, a computing-in-memory device 1000 may include a memory cell array 100 and a driver 200.

The driver 200 drives the memory cell array 100. Specifically, the driver 200 may apply multi-bit input data X0 to XM−1 to the memory cell array 100. In this case, the multi-bit input data is a digital input.

In addition, the driver 200 may apply a control signal CWL for reading pre-stored weights in each cell of the memory cell array 100 to the memory cell array 100. Accordingly, in each cell of the memory cell array 100, a multiplication operation of the analog voltage corresponding to the input data and the read weight may be performed.

The memory cell array 100 may include a plurality of analog multiplication units (AMUs) 110. In this case, each analog multiplication unit 110 may perform a multiply-accumulate (MAC) operation on the pre-stored weight and the analog voltage corresponding to the multi-bit input data.

To this end, the analog multiplication unit 110 may include memory cells for storing weights necessary for artificial intelligence operations and a digital-to-analog converter (DAC) 111 for converting a digital input into an analog voltage. In this case, the DAC 111 may be implemented inside the memory cell array 100 by utilizing the structure of memory cells. Specific details regarding this will be described later.

Specifically, when multi-bit input data is applied from the driver 200, the DAC 111 may convert the applied multi-bit input data into an analog voltage. In this case, a level of the analog voltage may correspond to the applied multi-bit input data.

Then, when the control signal CWL for reading the weights is applied from the driver 200, the AMU 110 may read the pre-stored weight in the memory cell and may perform a multiplication operation on the read weight and the analog voltage generated by the DAC 111.

Such a multiplication operation may be simultaneously performed in memory cells included in the AMU 110, and the AMU 110 may accumulate the multiplication operation results performed in each cell to output a MAC operation result.

As described above, according to an embodiment of the present disclosure, the DAC 111 using a memory structure inside the memory cell array 100 may be implemented and a multi-bit digital input may be converted into an analog value by using the DAC 111. Accordingly, a process yield of the computing-in-memory device 1000 may be increased. In addition, high linearity is ensured between the input and output of the DAC 111, so that the accuracy of the MAC operation may be increased. In addition, since more than 4 bits of input data can be used, higher artificial intelligence operation accuracy may be obtained than operations on 1-bit or 2-bit input data.

FIG. 2 is a block diagram illustrating an implementation example of a computing in-memory device, according to an embodiment of the present disclosure.

Referring to FIG. 2, the computing-in-memory device 1000 may include the driver 200, the memory cell array 100, and a control circuit 300.

The memory cell array 100 may include the plurality of AMUs 110. FIG. 2 illustrates an example in which 64 AMUs 110 from AMU[0] to AMU[63] are included in the memory cell array 110, but the number of AMUs 110 that can be included in the memory cell array 110 is not limited thereto. According to an embodiment, the memory cell array 100 may be a static random access memory (SRAM) cell array, but is not limited thereto.

The AMU 110 may include the memory cells for storing weights required for a MAC operation and the DAC 111 for converting digital input data into an analog voltage. Accordingly, the AMU 110 may perform the MAC operation on the pre-stored weight in the memory cell and the analog voltage corresponding to the multi-bit input data.

The driver 200 may drive the memory cell array 100. In particular, the driver 200 may apply multi-bit input data X0 to X15 and the control signal CWL for reading weights to the AMUs 110 of the memory cell array 100, respectively, to drive the memory cell array 100.

In this case, the driver 200 may apply multi-bit input data to the DAC 111 included in the AMU 110 through an input line. In addition, the driver 200 may apply the control signal CWL to the memory cell included in the AMU 110 through a computation word line CWL separate from the input line.

Referring to FIG. 2, the driver 200 may apply 4-bit input data X0[3:0] to X15[3:0] to the DAC 111 of each AMU 110 through an input line. In addition, the driver 200 may apply the 16-bit control signal CWL[15:0] to memory cells of each AMU 110 through the computation word line.

Accordingly, the 4-bit input data may be converted into a corresponding analog voltage through the DAC 111. In addition, a multiplication operation of an analog voltage corresponding to the 4-bit input data and a pre-stored weight may be simultaneously performed in each of the 16 memory cells. The multiplication operation result performed in each memory cell may be accumulated and then output as a MAC operation result.

The control circuit 300 may control overall operations of the computing-in-memory device 1000. In particular, the control circuit 300 may control the operations of the driver 200 and the memory cell array 100 such that the compute-in-memory device 1000 performs the aforementioned MAC operation.

For example, the control circuit 300 may control the operation of the driver 200 to adjust the timing at which the multi-bit input data X0 to X15 are applied and the timing at which the control signal CWL for reading the weight is applied, but is not limited thereto.

In addition, the control circuit 300 may apply various control signals such as PCHb, eACC, eMULTb, and eDAC to the memory cell array 100 for the aforementioned MAC operation of the AMU 110. Details of various control signals applied by the control circuit 300 will be described later.

Hereinafter, the configuration of the AMU 110 according to an embodiment of the present disclosure will be described with reference to FIGS. 3 to 4c.

FIG. 3 is a diagram for describing a configuration of an analog multiplication unit, according to an embodiment of the present disclosure.

According to one embodiment, the AMU 110 may include a plurality of local arrays corresponding to the number of bits of multi-bit input data. In this case, each of the plurality of local arrays may include a memory cell for storing a weight and a peripheral circuit configuring the digital-to-analog converter 111.

FIG. 3 illustrates an example of the AMU 110 in which 16 local arrays LA[0] to LA[15] corresponding to the 4-bit input data X[3:0] are connected in a row direction. In this case, LA[0] to LA[7] may be local arrays corresponding to the first digit of 4-bit input data. LA[8] to LA[11] may be local arrays corresponding to the second digit of 4-bit input data. LA[12] and LA[13] may be local arrays corresponding to the third digit of 4-bit input data. LA[14] may be a local array corresponding to the fourth digit of 4-bit input data. LA[15] may be a default local array.

Referring to FIG. 3, it can be seen that each of the 16 local arrays LA[0] to LA[15] includes a memory cell to which the control signal CWL[15:0] is applied and a peripheral circuit to which the 4-bit input data X[3:0] is input. In this case, the peripheral circuit of each local array may be of type A or type B. The A-type peripheral circuit may be electrically connected to adjacent peripheral circuits through an input bit line iBL to share charges. The B-type peripheral circuit includes a pass gate PGDAC, and may electrically connect or electrically separate adjacent peripheral circuits depending on on/off of the PGDAC.

In more detail, referring to FIG. 3, the peripheral circuits of LA[7], LA[11], LA[13], and LA[14] are of type B, and the remaining LA[0] to LA[6], LA[8] to LA[10], LA[12], and LA[15] are of type A. Accordingly, the capacitance ratio of iBL[3], iBL[2], iBL[1], and iBL[0] becomes 8:4:2:1 in a state where the PGDAC of the B-type peripheral circuit is turned off.

Meanwhile, peripheral circuits of the local arrays LA[0] to LA[15] may form the aforementioned DAC 111. Therefore, the DAC 111 may convert the 4-bit input data X[3:0] into an analog voltage using the capacitance ratios of iBL[3], iBL[2], iBL[1], and iBL[0].

Meanwhile, in the memory cells of each local array, a multiplication operation of input data converted into analog voltages and weights may be performed.

FIG. 4a is a diagram illustrating a configuration of a local array, according to an embodiment of the present disclosure. In FIG. 4a, BL represents a bit line, BLB represents a complementary bit line, CBL represents a computation bit line, ABL represents an accumulation bit line, and CWL represents the computation word line.

According to an embodiment of the present disclosure, the memory cells of the local array may have a P-8T SRAM cell structure. Referring to FIG. 4a, the P-8T SRAM cell structure may have a structure in which two PMOS transistors P0 and P1 are additionally connected to an existing 6T SRAM cell structure capable of only read/write operations, as illustrated. Through such a structure, a multiplication operation may be performed in CBL.

Meanwhile, the local array may include peripheral circuits configuring the DAC 111. In this case, as described above, there are two types of peripheral circuits, A type and B type.

FIG. 4b illustrates an example of the A-type peripheral circuit. Referring to FIG. 4b, the A-type peripheral circuit may be electrically connected to adjacent peripheral circuits through the input bit line iBL to share charges with each other.

FIG. 4c illustrates an example of the B-type peripheral circuit. Referring to FIG. 4c, the B-type peripheral circuit may have the same configuration as the A-type peripheral circuit of FIG. 4b except for further including the pass gate PGDAC. The pass gate PGDAC may be turned on/off according to the control signal eDAC. When the PGDAC is turned on, the B-type peripheral circuit has the same configuration as the A-type peripheral circuit, and may share charges with adjacent peripheral circuits through the input bit line iBL. Meanwhile, when the PGDAC is turned off, the B-type peripheral circuit is electrically separated from peripheral circuits belonging to other digits among adjacent peripheral circuits, and may be blocked from charge sharing with peripheral circuits belonging to other digits.

Meanwhile, detail operations of peripheral circuits according to control signals such as eACC, eMULTb, and eDAC will be described later.

Hereinafter, a digital-to-analog conversion operation of the AMU 110 according to an embodiment of the present disclosure will be described with reference to FIGS. 5 to 6b.

FIG. 5 is a diagram for describing a digital-to-analog conversion operation of an analog multiplication unit, according to an embodiment of the present disclosure. In detail, FIG. 5 illustrates a state in which the 4-bit input data X[3:0] is applied to the AMU 110 of FIG. 3.

Referring to FIG. 5, CBL[0] to CBL[7] are connected to iBL[3], CBL[8] to CBL[11] are connected to iBL[2], CBL [12] and CBL[13] ] is connected to iBL[1], and CBL[14] is connected to iBL[0]. Meanwhile, since a ground voltage VSS is always applied to the gate of N15, CBL[15] is always maintained at VDD.

According to an embodiment, before the 4-bit input data X[3:0] is applied, CBL[0] to CBL[15] may be first initialized to the driving voltage VDD. In this case, the PGDAC included in the peripheral circuits of LA[7], LA[11], LA[13], and LA[14] may maintain a turned off state.

Thereafter, the 4-bit input data X[3:0] may be applied from the driver 200 to the AMU 110. In this case, the AMU 110 may receive bit values corresponding to each digit of the 4-bit input data through peripheral circuits of the local array corresponding to each digit of the 4-bit input data. Referring to FIG. 5, it may be seen that among the 4-bit input data X[3:0], X[3] is applied through LA[0] to LA[7] peripheral circuits, X[2] is applied through LA[8] to LA[11] peripheral circuits, X[1] is applied through LA[12] and LA[13] peripheral circuits, and X[0] is applied through LA[14] peripheral circuit.

In detail, when X[3] is 1, N0 to N7 are turned on, and iBL[3] is discharged to the ground voltage VSS. When X[3] is 0, N0 to N7 maintain a turned off state, and iBL[3] maintains the pre-charged driving voltage VDD.

Meanwhile, when X[2] is 1, N8 to N11 are turned on, and iBL[2] is discharged to the ground voltage VSS. When X[2] is 0, N8 to N11 maintain a turned off state, and iBL[2] maintains the driving voltage VDD.

Meanwhile, when X[1] is 1, N12 and N13 are turned on, and iBL[1] is discharged to the ground voltage VSS. When X[1] is 0, N12 to N13 maintain a turned off state, and iBL[1] maintains the driving voltage VDD.

Meanwhile, when X[0] is 1, N14 is turned on, and iBL[0] is discharged to the ground voltage VSS. When X[0] is 0, N14 maintains a turned off state, and iBL[0] maintains the driving voltage VDD.

Even while 4-bit input data X[3:0] is applied, the PGDAC included in the peripheral circuits of LA[7], LA[11], LA[13], and LA[14] may remain a turned off state.

Therefore, for example, when X[3:0] is 1000(2), as illustrated in FIG. 5, iBL[3] may become VSS, iBL[2] may become VDD, iBL[1] may become VDD, and iBL[0] may become VDD.

According to an embodiment, the number of local arrays corresponding to each digit of multi-bit input data may be different for each digit. Referring to FIG. 5, it may be seen that the number of local layers corresponding to each digit X[3], X[2], X[1], X[0] of 4-bit input data X[3:0] is different depending on the number of digits, such as 8, 4, 2, and 1.

FIG. 6a illustrates the operation of the DAC 111 when the PGDAC included in peripheral circuits of LA[7], LA[11], LA[13], and LA[14] is turned on through the control signal eDAC in a state in which 4-bit input data is applied as illustrated in FIG. 5.

Referring to FIG. 6a, when PGDAC included in the peripheral circuits of LA[7], LA[11], LA[13], and LA[14] is turned on in a state in which the 4-bit input data is applied, charges are shared in a row direction through iBL[3], iBL[2], iBL[1], and iBL[0], so that an analog voltage corresponding to the 4-bit input data may be applied to CBL[0] to CBL[15].

According to an embodiment, the 4-bit input data and the analog voltage may have a relationship as illustrated in Equation 1 below.

$$V_{DAC} = \left( \sum_{n=0}^{3} (2^N \cdot \overline{X_{[N]}}) + 1 \right) \cdot \frac{VDD}{16} \quad \text{[Equation 1]}$$

Here, VDAC represents an analog voltage VCBL applied to CBL[0] to CBL[15], 'N' represents an 'N' value when the number of digits of each bit of 4-bit input data is expressed as 2N, $\overline{X_{[N]}}$ represents the opposite value of the bit value corresponding to the number of 2N digits of 4-bit input data, and VDD represents the driving voltage of the AMU 110. Here, the opposite value of 1 is 0, and the opposite value of 0 is 1.

Meanwhile, FIG. 6b is a table illustrating calculation results according to Equation 1 above. In FIG. 6b, 4-bit i.Act X[3:0] represents 4-bit input data, and 16-level Analog VCBL represents 16 analog voltages corresponding to each input data.

For example, when the 4-bit input data is 0001, VDAC becomes [{(20*0)+(21*1)+(22*1)+(23*1)}+1]*(VDD/16), which eventually becomes (15/16)*VDD, and which is consistent with the result of FIG. 6b.

As described in FIGS. 5 to 6b, the DAC 111 composed of peripheral circuits of the local arrays LA[0] to LA[15] may convert the multi-bit input data into the analog voltage VDAC by electrically connecting peripheral circuits belonging to different digits, when the multi-bit input data is applied in a state in which peripheral circuits belonging to different digits are electrically separated from each other.

FIG. 7a is a diagram for describing a multiplication calculation operation of an analog multiplication unit, according to an embodiment of the present disclosure. According to an embodiment, the AMU 110 may perform a multiplication operation on the pre-stored weight in the memory cell and the analog voltage when the control signal CWL for reading the pre-stored weight in the memory cell is applied from the driver 200.

Referring to FIG. 7a, the connection between the iBL of the peripheral circuit and the memory cell is cut off according to the control signal eMULTb, and the voltage of CWL becomes VSS. Accordingly, it may be seen that the multiplication operation on the 4-bit input data converted to the analog level and the pre-stored weight in the memory cell.

In this case, the pre-stored weight W[i] in the memory cell may have a value of 0 or 1. Therefore, when W[i] is 0, both P0 and P1 are turned on, and the voltage VCBL of CBL is charged to VDD. In contrast, when W[i] is 1, since P0 is turned off, VCBL maintains VDAC.

FIG. 7b illustrates a table of multiplication operation results of 4-bit input data according to weights.

FIGS. 8a and 8b are diagrams for describing an accumulation calculation operation of an analog multiplication unit according to an embodiment of the present disclosure. According to an embodiment, the AMU 110 may perform an accumulation operation on multiplication operation results performed in each of a plurality of local arrays included in the AMU 110 and may output the accumulation operation result as an analog voltage.

Referring to FIG. 8a, the multiplication result formed as an analog voltage in the CBL of each local array LA of the AMU 110 is accumulated through charge sharing in the column direction, and finally, it may be seen that the MAC operation result is expressed in the ABL as an analog value. In this case, ABL<0> to ABL<63> correspond to AMU[0] to AMU[63], respectively.

In detail, referring to FIG. 8b, when the control signal eACC is applied in a state in which the multiplication result of each local array LA0 to LA15 is formed as analog voltages VCBL,0 to VCBL,15 in CBL, the AMU 110 may accumulate the multiplication result to output as an analog voltage to the ABL.

In this case, according to an embodiment, the analog voltage VABL output through the ABL may be calculated as in Equation 2 below.

$$V_{ABL} = \frac{\sum_{k=0}^{15} (C_{CBL} \cdot V_{CBL,i})^\circ C_{ABL} - VDD}{16 \; C_{CBL} + C_{ABL}} \quad \text{[Equation 2]}$$

Here, VABL represents the analog voltage output through the ABL, CCBL represents the capacitance of CBL, VCBL,i represents the multiplication operation result of the i-th local array, and CABL represents the capacitance of the ABL.

Meanwhile, the MAC operation result output to the ABL may be used after being converted into a digital value using an analog-to-digital converter. To this end, the computing-in-memory device 1000 may further include an analog-to-digital converter (ADC) for converting an analog voltage into a digital value.

FIG. 9 is a diagram illustrating waveforms of various signals of a computing in memory device, according to an embodiment of the present disclosure.

Referring to FIG. 9, in a precharge stage, CBL, iBL, and ABL may all be initialized to VDD. In this case, referring to FIGS. 8b and 9, a low signal may be applied to the PMOS to which the control signal PCHb is applied, and the control signal eACC may be activated.

Thereafter, when 4-bit input data is applied to the DAC 111 of the AMU 110, VDD voltage or VSS voltage is formed on iBL[3], iBL[2], iBL[1], iBL[0] according to each bit value of the input data. Subsequently, the DAC 111 may form an analog voltage corresponding to 4-bit input data in the CBL by sharing charges in a row direction based on the control signal eDAC.

Then, when the control signal eMULTb is deactivated, the AMU 110 may disconnect the iBL of the peripheral circuit from the memory cell based on the deactivated control signal eMULTb. Also, when VSS is applied to CWL through the control signal CWL, the AMU 110 may perform a multiplication operation in each memory cell.

Meanwhile, although not illustrated in the drawings, when the control signal eACC is subsequently activated, the AMU 110 may charge-share the multiplication result formed in each local array in a column direction based on the activated control signal eACC. Accordingly, the MAC operation result may be finally expressed as an analog voltage in the ABL. Thereafter, the analog voltage applied to the ABL is converted into a digital value through an analog-to-digital converter (ADC) and may be used in various ways.

In the above description, the case in which multi-bit input data is 4-bit input data is described as an example, but the embodiment is not limited thereto, and various embodiments of the present disclosure may be modified and used for MAC operation on input data with a larger number of bits.

Meanwhile, various embodiments of the present disclosure may be applied to all products using an embedded memory. In addition, it may be applied to various operation processors such as an artificial intelligence (AI) device using a cache memory, an application processor (AP), a central processing unit (CPU), and a neural processing unit (NPU).

According to various embodiments of the present disclosure as described above, by performing a MAC operation inside a memory, in an artificial intelligence operation such as DNN (Deep Neural Networks), the number of data movement between a memory and an operator may decrease. Accordingly, the energy efficiency of the artificial intelligence operations may increase.

In addition, when the multi-bit input data is converted into an analog voltage, using a DAC inside the memory has an advantage in process yield and increases the linearity of the MAC operation so that accurate calculation may be performed.

In addition, since more than 4 bits of input data can be used, higher artificial intelligence operation accuracy may be obtained than operations on 1-bit or 2-bit input data.

The above description is merely illustrative of the technical idea of the present disclosure, and those of ordinary skill in the art to which the present disclosure pertains will be able to make various modifications and variations without departing from the essential characteristics of the present disclosure. Therefore, embodiments of the present disclosure are not intended to limit the technical spirit of the present disclosure, but provided only for the illustrative purpose, and the scope of the technical idea of the present disclosure is not limited by these embodiments. Accordingly, the scope of protection of the present disclosure should be construed by the attached claims, and all equivalents thereof should be construed as being included within the scope of the present disclosure.

EXPLANATION OF REFERENCE NUMERALS

1000: computing-in-memory device
100: memory cell array
200: driver
300: control circuit
110: analog multiplication unit
111: digital-to-analog converter

The invention claimed is:

1. A computing-in-memory device comprising:
a memory cell array comprising an analog multiplication unit configured to perform a multiply-accumulate (MAC) operation on a pre-stored weight and a first analog voltage corresponding to multi-bit input data; and
a driver configured to apply the multi-bit input data to the analog multiplication unit,
wherein the analog multiplication unit comprises a digital-to-analog converter configured to convert the multi-bit input data into the first analog voltage,
wherein the analog multiplication unit comprises a plurality of local arrays corresponding to number of bits of the multi-bit input data,
wherein each of the plurality of local arrays comprises a memory cell configured to store the pre-stored weight, and a peripheral circuit configured to form the digital-to-analog converter, and
wherein the digital-to-analog converter, when the multi-bit input data is applied in a state in which a plurality of the peripheral circuits belonging to different digits are electrically separated, converts the multi-bit input data into the first analog voltage by electrically connecting the plurality of the peripheral circuits.

2. The computing-in-memory device of claim 1, wherein among the plurality of local arrays, number of local arrays corresponding to first digit and number of local arrays corresponding to second digit of the multi-bit input data are different from each other.

3. The computing-in-memory device of claim 2, wherein the analog multiplication unit receives a bit value corresponding to each digit of the multi-bit input data through the peripheral circuit of the local array corresponding to each digit of the multi-bit input data.

4. The computing-in-memory device of claim 1, wherein the analog multiplication unit, when a control signal for reading the pre-stored weight in the memory cell is applied from the driver, performs a multiplication operation on the pre-stored weight in the memory cell and the first analog voltage.

5. The computing-in-memory device of claim 4, wherein the analog multiplication unit performs an accumulation operation on results of the multiplication operation performed in each of the plurality of local arrays, and outputs the results of the accumulation operation as a second analog voltage.

6. The computing-in-memory device of claim 5, further comprising:
an analog-to-digital converter configured to convert the second analog voltage into a digital value.

7. The computing-in-memory device of claim 4, wherein the driver applies the control signal to the analog multiplication unit through a computation word line and applies the multi-bit input data to the digital-to-analog converter through an input line separate from the computation word line.

8. The computing-in-memory device of claim 1, wherein the memory cell is an SRAM (Static Random Access Memory) cell.

* * * * *